United States Patent [19]

Allison

[11] Patent Number: 5,662,452

[45] Date of Patent: Sep. 2, 1997

[54] APPARATUS AND METHOD OF ALIGNING NOTCHES USING A FREE-FLOATING ROD

[75] Inventor: Quincy D. Allison, Boulder Creek, Calif.

[73] Assignee: H-Square Corporation, Sunnyvale, Calif.

[21] Appl. No.: 703,129

[22] Filed: Aug. 26, 1996

[51] Int. Cl.$^6$ ................................. B65G 47/24
[52] U.S. Cl. ..................... 414/757; 198/394; 414/936; 414/938; 414/786
[58] Field of Search ................... 414/433, 757, 414/786, 936, 938; 198/394

[56] References Cited

U.S. PATENT DOCUMENTS

| | | | |
|---|---|---|---|
| 3,997,065 | 12/1976 | Jaksch . | |
| 4,311,427 | 1/1982 | Coad et al. | 414/217 |
| 4,441,853 | 4/1984 | Kosugi | 414/757 |
| 4,662,811 | 5/1987 | Hayden | 414/433 |
| 5,183,378 | 2/1993 | Asano et al. | 414/757 |
| 5,551,829 | 9/1996 | Jerolimov et al. | 414/757 |

OTHER PUBLICATIONS

V.J. Delgado, "Semiconductor Wafer Alignment Fixture," *IBM Technical Disclosure Bulletin*, vol. 10, No. 6, Nov. 1967, pp. 828–829.

*Primary Examiner*—Karen B. Merritt
*Assistant Examiner*—Janice L. Krizek
*Attorney, Agent, or Firm*—Terry McHugh

[57] ABSTRACT

An apparatus and method for aligning indexing notches of disk-shaped members, such as semiconductor wafers, include providing an alignment rod that is driven by another roller to cause rotation of the disk-shaped members. The circumferential surfaces of the alignment rod and the drive roller are in frictional contact. Initially, the disk-shaped members rest upon the alignment rod, so that rotation of the alignment rod causes rotation of the disk-shaped members until indexing notches are seated on the alignment rod. In the preferred embodiment, the seating of the indexing notches transfers at least a portion of the weight of the disk-shaped members to a reciprocating structure, such as a comb member. After all of the indexing notches have been aligned, a second weight transfer occurs, with the reciprocating structure following the contour of the drive roller and the disk-shaped members coming to rest on the drive roller. The disk-shaped members can then be uniformly rotated to locate the notches as desired. In the preferred embodiment, the alignment rod is a free-floating nylon member.

15 Claims, 4 Drawing Sheets

APPARATUS AND METHOD OF ALIGNING NOTCHES USING A FREE-FLOATING ROD

TECHNICAL FIELD

The invention relates generally to indexing disk-shaped members and more particularly to a method and system for aligning indexing notches of an array of disks, such as semiconductor wafers.

BACKGROUND ART

Semiconductor wafer fabrication techniques often require precise positioning of a wafer. For example, a fabrication step that includes ion implantation requires that the orientation of the crystalline lattice of the semiconductor material be known. As another example, there must be a precise alignment of a semiconductor wafer relative to a reticle or photomask for patterning a conductive layer to form signal paths along previously fabricated circuit structure on the wafer.

Typically, a semiconductor wafer includes a "wafer flat" or an indexing notch. A wafer flat or notch is an edge feature that is used to identify the orientation of the wafer. Orientation devices for aligning semiconductor wafers having wafer flats are described in U.S. Pat. No. 5,183,378 to Asano et al., U.S. Pat. No. 4,441,853 to Kosugi, U.S. Pat. No. 4,311,427 to Coad et al., and U.S. Pat. No. 3,997,065 to Jaksch.

Also known are "notch finders" that are designed to align the notches of semiconductor wafers contained within a cassette. The notch finder may have a small diameter stainless steel rod having a coating of polyvinyldenefloride. When the cassette is positioned on the notch finder, the edges of the semiconductor wafers contact the stainless steel rod. Rotation of the stainless steel rod causes the wafers to rotate within the cassette. When a notch of a rotating wafer reaches the stainless steel rod, the notch allows the wafer to drop slightly onto the rod. The stainless steel rod continues to rotate, but the notch-to-rod registration prevents further rotation of the wafer. Within a relatively short time, all of the wafers in the cassette are aligned.

A notch finder may include a mechanism for uniformly rotating the wafers following the notch-alignment operation. Rollers may be positioned on opposite sides of the stainless steel rod out of contact with the wafers during the notch-alignment operation. Then, the rollers may be moved upwardly to contact the edges of the wafers, lifting the notches away from the stainless steel rod. The rollers can then be rotated to relocate the aligned notches to a desired position.

Conventional notch finders operate well for their intended purpose. However, there are concerns relating to operation of the conventional notch finders. As previously noted, the stainless steel rod continues to rotate after the first notch is brought into registration with the rod. Rotation of the stainless steel rod against the stationary edges of the notches generates noises that are potentially disruptive to persons in the general vicinity of the notch finder. More importantly, the relative rotation between the stainless steel rod and the semiconductor wafer may generate particles that settle on the surface of one of the wafers. Particulate contamination will adversely affect the manufacturing throughput of the semiconductor fabrication process. Another concern is that as the rollers are moved upwardly to lift the wafers from the alignment bar, the lifting rollers may cause nonuniform rotation of the wafers. Even a minute amount of undesired rotation may cause difficulties during a subsequent fabrication step.

An object of the invention is to provide an orientation method and apparatus for aligning disk-shaped members, such as semiconductor wafers, having indexing notches. Another object is to provide such a method and apparatus that achieve the alignment in a nonparticulating manner having a small number of operating components, thereby providing cost benefits.

SUMMARY OF THE INVENTION

The above objects have been met by an orientation method and apparatus for aligning indexing notches using a free-floating alignment rod. The indexing notches are edge features of disk-shaped members, such as semiconductor wafers, and each indexing notch has a radius of curvature that is slightly greater than the radius of the alignment rod. In the preferred embodiment, the notch-alignment operation is executed using three cooperating components that provide multiple weight transfers.

In this preferred embodiment, the disk-shaped members are supported in generally parallel and upright positions, with edges resting on the circumference of the free-floating alignment rod. Thus, the alignment rod initially supports the weight of the disk-shaped members. The circumference of the alignment rod is also in contact with a drive roller. The alignment rod is secured against the drive roller by a reciprocating structure. In the preferred embodiment, the reciprocating structure is a comb-like member having an array of teeth that are arranged such that a disk-shaped member is located between adjacent teeth. The alignment rod is exposed in the areas between adjacent teeth.

In operation, the drive roller is rotated, with the frictional contact between the drive roller and the alignment rod causing rotation of the alignment rod. The alignment rod is "free-floating," since it is not directly driven. The edge contact of the disk-shaped members with the alignment rod causes the members to rotate. When the indexing notch of a disk-shaped member rotates into alignment with the alignment rod, the notch allows the disk-shaped member to drop slightly. As a result, at least a portion of the weight of the aligned disk-shaped member is transferred to the reciprocating structure. This weight transfer reduces the likelihood that the contact of the still rotating alignment rod with the stationary disk-shaped member will generate particulate matter.

After all of the indexing notches are aligned, the drive roller is stopped. The reciprocating structure is then repositioned to transfer the weight of the disk-shaped members to the drive roller. In the preferred embodiment, the repositioning follows the curvature of the drive roller, so that the free-floating alignment rod remains trapped against the drive roller as it rolls along the circumference of the drive roller. The drive roller is again rotated to rotate the disk-shaped members in unison until the indexing notches reach a predefined position.

The selection of the material for forming the alignment rod is important. The material must be non-particulating. The flexible alignment rod should be wear resistant and chemical resistant, since there may be times in which semiconductor wafers are brought into contact with the orientation apparatus shortly after undergoing chemical treatment. Another important property is the coefficient of friction. The friction of the alignment rod along the edges of the disk-shaped members and along the circumference of the drive roller initiates the necessary rotations. An acceptable material for forming the flexible alignment rod is nylon.

An advantage of the invention is that the cooperation between the drive roller, the alignment rod, and the reciprocating structures reduces the number of working components. In a notch-alignment operation, the reciprocating member captures the alignment rod against the circumference of the drive roller, so that rotation of the drive roller is reliably transferred to the alignment rod. After a disk-shaped member has been brought into notch alignment with the alignment rod, the reciprocating member supports at least a portion of the weight of the disk-shaped member. Following the notch-alignment operation, the reciprocating member rolls the alignment rod along the circumference of the drive roller, so that the drive roller then supports the disk-shaped members for uniform rotation. The cooperative operations provide a structure having a small number of contacting parts, thereby reducing the likelihood of particle generation. Moreover, there are resulting manufacturing cost savings.

BEST MODE FOR CARRYING OUT THE INVENTION

Figure 1:
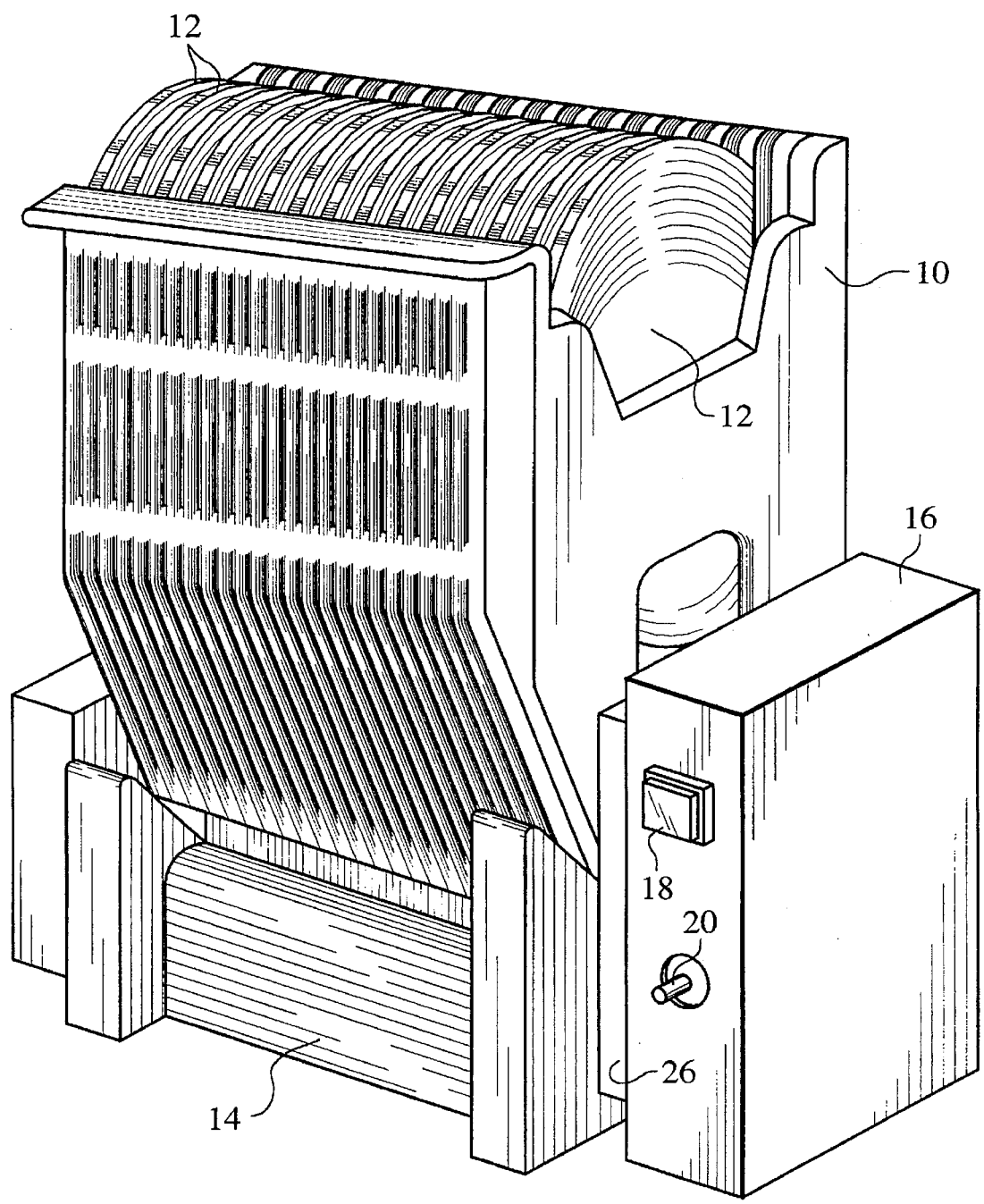
FIG. 1 is a perspective view of a cassette of semiconductor wafers resting on an apparatus for aligning indexing notches, in accordance with the invention.

With reference to FIG. 1, a cassette 10 of semiconductor wafers 12 is shown as being rested atop an orientation apparatus, which is sometimes referred to as a "notch finder" 14. The notch finder is designed to align semiconductor wafers having indexing notches that are dimensioned to meet SEMI standards. The cassette 10 is conventionally used in the industry. The semiconductor wafers are equidistantly spaced within the cassette, so that the wafers do not make contact during storage, transportation or handling. The use of the orientation apparatus to align indexing notches of semiconductor wafers is the preferred application of the invention, but other applications are contemplated.

The notch finder 14 includes a housing 16 for most of the electrical and mechanical components for operating the apparatus. The housing is used to reduce the likelihood that particulate matter that may be generated by various components, such as a drive motor, will enter the surrounding atmosphere. At the exterior of the housing are a "run" switch 18 and a "position" switch 20. As will be explained more fully below, actuation of the run switch 18 will initiate alignment of the indexing notches along a flexible alignment rod, not shown. The position switch 20 may be preset to select a final notch location. After the indexing notches are aligned along the flexible alignment rod, the wafers 12 are uniformly rotated within the cassette 10 until the notches reach the selected final notch location.

Figure 2:
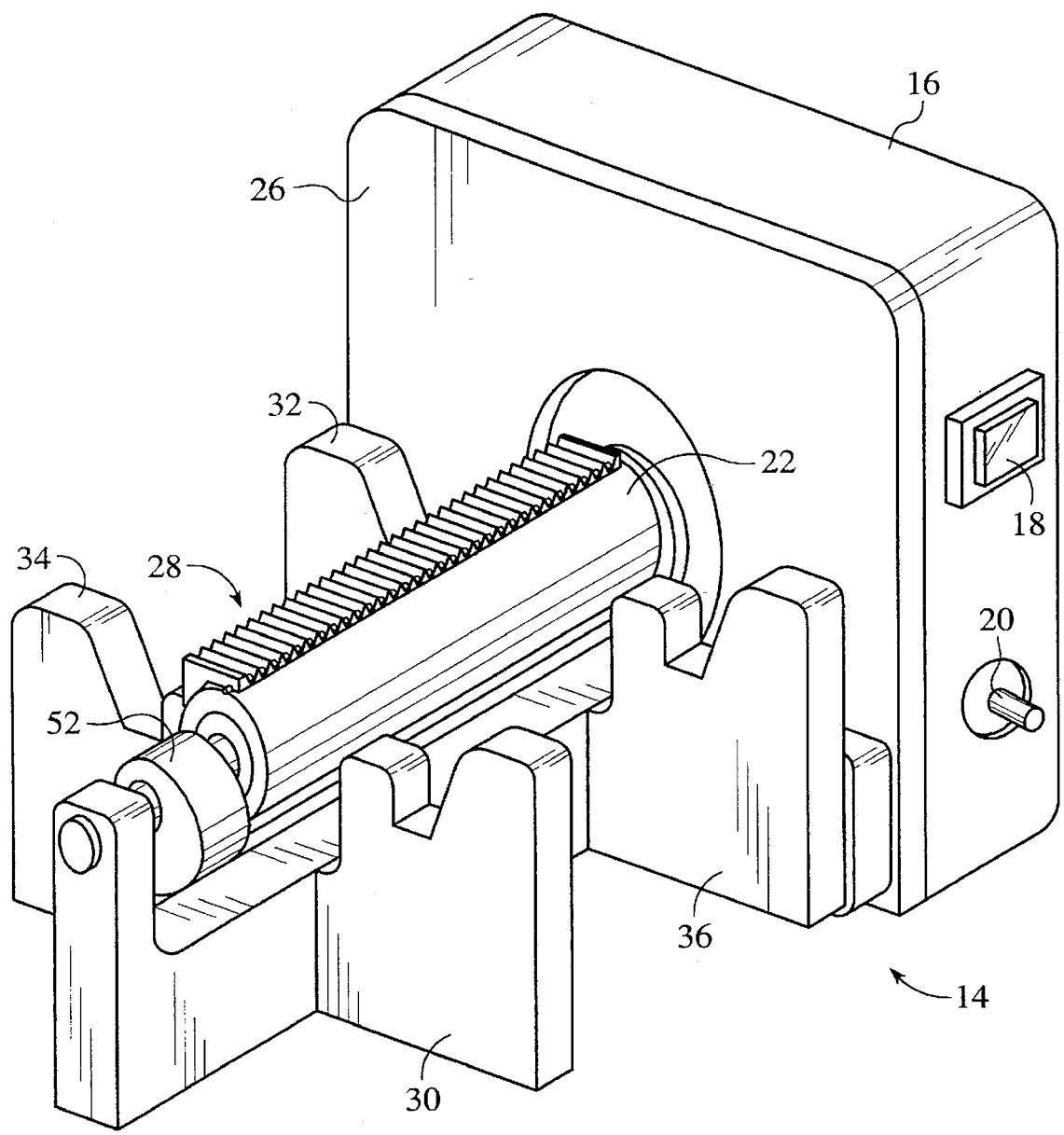
FIG. 2 is a perspective view of the apparatus of FIG. 1 without the cassette.
Figure 3:
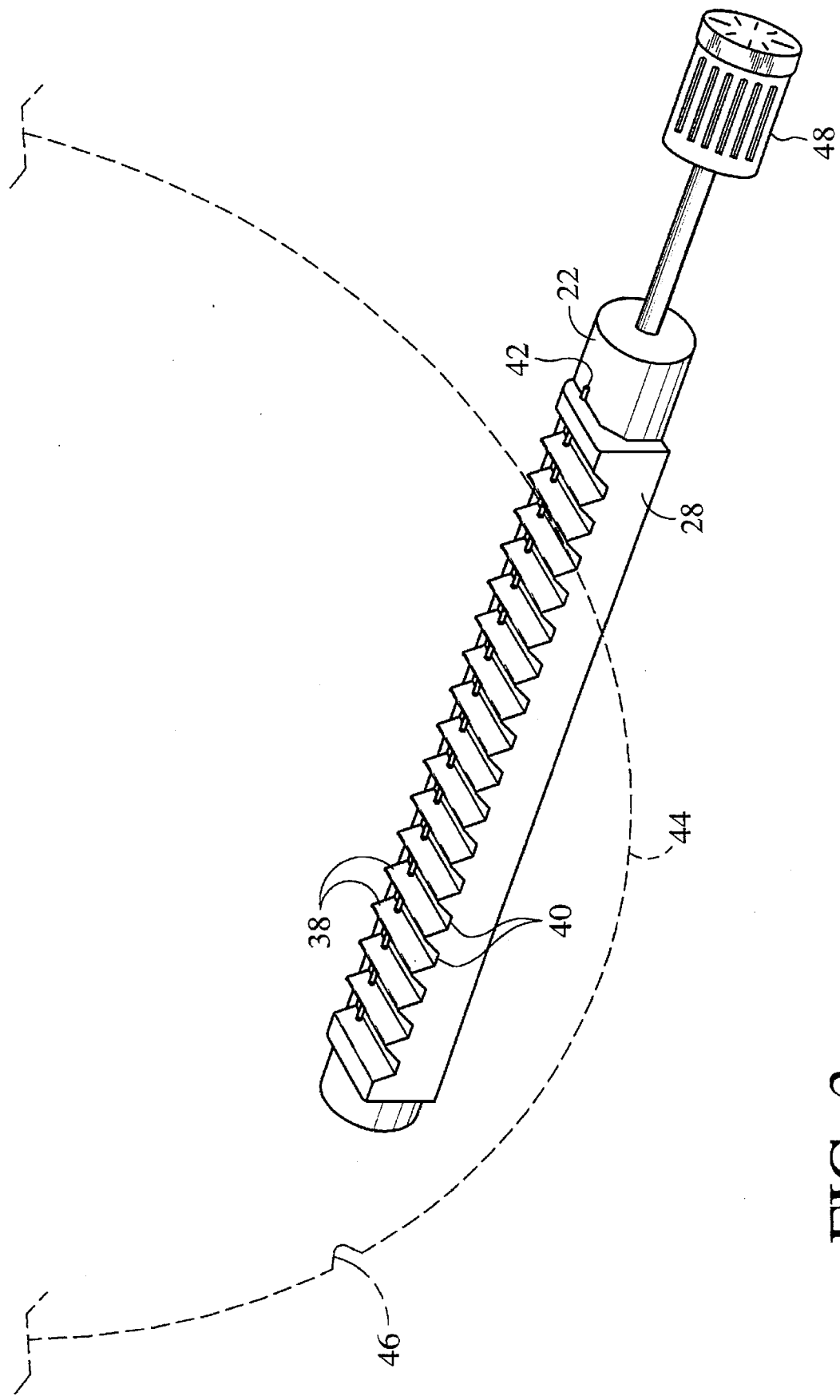
FIG. 3 is a perspective view of the structure for rotating the semiconductor wafers of FIG. 1.

Referring now to FIGS. 2 and 3, the notch finder 14 includes a drive roller 22 that is connected to a drive motor within the housing 16. The drive motor is mounted to a faceplate 26. As will be explained more fully below, the rotation of the drive roller 22 is transferred to a free-floating alignment rod that is captured against the circular exterior of the drive roller by a reciprocating structure 28. In the preferred embodiment, the reciprocating structure includes a comb-like upper surface.

The notch finder 14 includes four support members 30, 32, 34 and 36 that are configured to receive a conventional cassette. The configuration of the supports will depend upon the application of the invention.

Comparing FIGS. 1 and 2, the disk-shaped members, i.e. semiconductor wafers 12, are aligned in generally upright and parallel positions. In the preferred embodiment, the number of semiconductor wafers corresponds to the number of spaces between adjacent teeth of the reciprocating structure 28. Thus, the pitch of the teeth corresponds to the pitch of the semiconductor wafers, but the teeth are 180° out of phase with the wafers, so that a properly positioned cassette will cause the wafers to fall between the teeth.

Referring now to FIGS. 1-3, the reciprocating member includes an array of teeth 38 in which adjacent teeth are spaced apart by planar regions 40. A free-floating alignment rod 42 is exposed between adjacent teeth. Consequently, when the semiconductor wafer 44 having an indexing notch 46 is properly positioned, the edge of the semiconductor wafer contacts the free-floating alignment rod.

Figure 4:
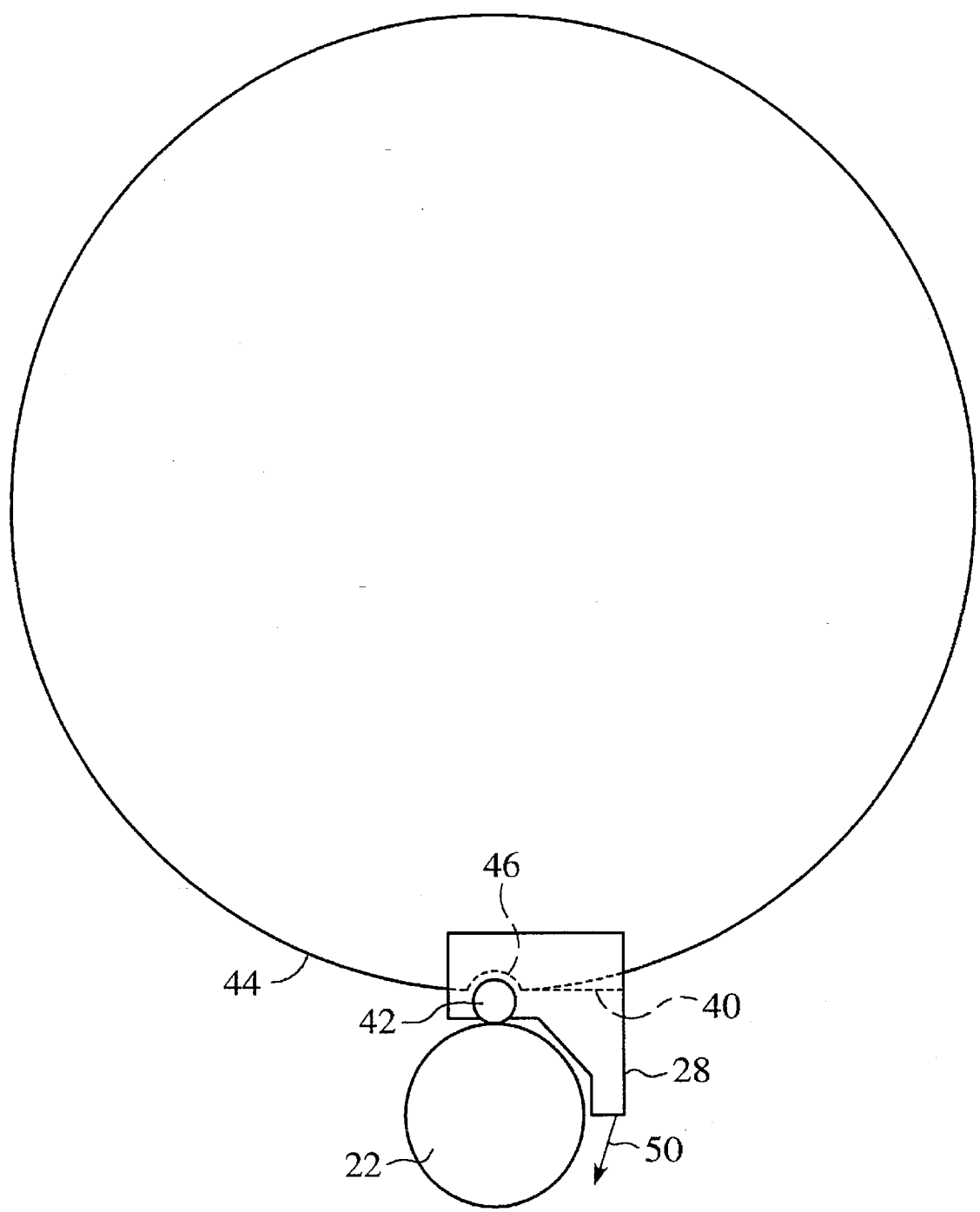
FIG. 4 is a side view of the structure of FIG. 3.

The edge of the semiconductor wafer 44 contacts the circumference of the free-floating alignment rod when the indexing notch 46 is misaligned with the alignment rod. As best seen in FIG. 4, the reciprocating structure 28 traps the alignment rod 42 against the drive roller 22. That is, the circumference of the drive roller 22 is in frictional contact with the circumference of the alignment rod.

There are a number of important properties in the selection of a material for forming the alignment rod. Firstly, the alignment rod is driven by the drive roller 22, so that the surface tension between the two circumferential surfaces must be sufficient to reliably transfer the rotational energy of the drive roller. Secondly, the alignment rod must be non-particulating. The rotating alignment rod contacts a number of structures, so that it should be formed of a material that does not generate particles which would contaminate the semiconductor wafer 44. A third property relates to resistance to chemical attack. Potentially, the semiconductor wafer may be brought into contact with the notch finder immediately following a wafer fabrication step that includes applying chemical solution. The alignment rod should not deteriorate upon contact with a residue of the solution.

In the preferred embodiment, the alignment rod is formed of nylon. Nylon provides sufficient friction against the drive roller 22 and the edge of the semiconductor wafer 44 to reliably rotate the wafer when the drive roller is rotated. Moreover, the nylon alignment rod is less likely to generate contaminating particles. Nylon provides the desired resistance to wear and to chemical attack. However, other materials are appropriate, including stainless steel.

In operation, the drive motor 48 of FIG. 3 is activated to rotate the drive roller 22. The rotation of the drive roller causes the free-floating alignment rod 42 to rotate. In turn, the rotation of the alignment rod is imparted to the semiconductor wafer 44, causing the indexing notch 46 to eventually come into alignment with the alignment rod. This notch-to-rod alignment is shown in FIG. 4. The dimensions of the indexing notch are standardized in the industry. By selecting the radius of the alignment rod to be slightly less than the radius of curvature of the indexing notch, the semiconductor wafer will drop slightly when the notch-to-rod alignment is achieved. For semiconductor wafers, the alignment rod may have a radius of 0.08 cm or less.

In the preferred embodiment, a portion of the weight of the semiconductor wafer 44 is transferred from the alignment rod 42 to the reciprocating structure 28 when the indexing notch 46 is aligned with the alignment rod 42. The edge of the semiconductor wafer is shown as resting upon the planar region 40 of the reciprocating member 28 in FIG. 4. This transfer of the weight of the semiconductor wafer is shown as spacing the edge of the notch 46 away from the alignment rod 42. However, in practice some of the weight of the semiconductor wafer will remain supported by the alignment rod.

The contact of the edge of the semiconductor wafer 44 with the planar region 40 of the reciprocating structure 28 at least reduces the frictional contact between the indexing notch 46 and the alignment rod 42. As a result, "grinding" is less likely to occur, thereby reducing the likelihood of particle generation.

The free-floating alignment rod 42 is rotated for a sufficient duration to ensure that the semiconductor wafers 44 rotate at least 360°. This ensures that the indexing notches 46 are all aligned with the alignment rod 42. As previously noted, this alignment includes a partial weight transfer from the alignment rod to the reciprocating structure 28. In the preferred embodiment, a second weight transfer then occurs. As indicated by arrow 50 in FIG. 4, the reciprocating structure is displaceable. The reciprocating structure rotates about the drive roller 22, allowing the semiconductor wafer 44 to descend onto the upper region of the drive roller. In the preferred embodiment, the movement of the displaceable structure 28 is concentric with the drive roller, but this is not critical. Other ranges of motion of the reciprocating structure are possible. An advantage of the arcuate displacement is that the alignment rod 42 will follow the circumference of the drive roller, thereby ensuring that the alignment rod remains trapped against the drive roller. Another advantage is that the arcuate displacement has a low risk of causing dissimilar displacements of the various indexing notches 46. Rotation of the notches is acceptable if the rotation is known and is uniform among the semiconductor wafers.

After the semiconductor wafers 44 are rested on the upper portion of the drive roller 22, the drive roller can be driven in order to uniformly rotate the indexing notches 46 to any desired position. For example, the required final orientation may be to position all of the indexing notches at the tops of the semiconductor wafers.

The means for moving the reciprocating structure 28 from the operational position shown in FIG. 4 to the position in which the semiconductor wafers 44 are brought into contact with the drive roller 22 is not critical. In one embodiment, the position of the reciprocating structure 28 is determined by a cam arrangement that is contained within the housing 16 of FIG. 1. The camming action may be driven by the same motor 48 that rotates the drive roller 22 of FIG. 3 or by a separate motor. Referring now to FIG. 2, a cam 52 may alternatively be located at the end of the notch finder 14 opposite to the housing 16. For example, a clutch may be used to determine when the cam 52 is to be driven.

An advantage of the invention is that the three-piece assembly of the drive roller 22, the reciprocating structure 28 and the free-floating alignment rod 42 provides reliable weight transfers and notch alignments with a small number of parts. Thus, the assembly is cost efficient. However, there may be applications in which other weight-transfer means are desired. Additional rollers may be provided to lift the semiconductor wafers away from the reciprocating structure 28 after the wafers have been aligned. The additional rollers may then be used to uniformly rotate the indexing notches to the desired position.

I claim:

1. An apparatus for aligning a plurality of disk-shaped members having indexing notches comprising:

support means for supporting said disk-shaped members;

a free-floating alignment rod positioned relative to said support means to contact edges of said disk-shaped members;

a drive roller on a side of said free-floating alignment rod opposite to said support means;

reciprocating means for securing said free-floating alignment rod into contact with said drive roller and for supporting said disk-shaped members when said indexing notches are aligned along said free-floating alignment rod;

means for rotating said drive roller, said rotation being translated to said free-floating alignment rod; and means for selectively displacing said reciprocating means and said free-floating alignment rod to allow said disk-shaped members to rest on said drive roller, said reciprocating means thereby having a first position for a notch-aligning operation and having a second position in which said disk-shaped members are rested on said drive roller.

2. The apparatus of claim 1 wherein said free-floating rod is a flexible member in frictional contact with said drive roller.

3. The apparatus of claim 1 wherein said reciprocating means is a comb structure having spaced apart teeth aligned to receive one of said disk-shaped members between adjacent teeth.

4. The apparatus of claim 3 wherein said free-floating alignment rod is exposed between said adjacent teeth.

5. The apparatus of claim 1 wherein said means for selectively displacing said reciprocating means and said free-floating alignment rod includes a motor-driven cam member, said reciprocating means being displaceable along the curvature of said drive roller such that said free-floating alignment rod follows the circumference of said drive roller.

6. The apparatus of claim 1 wherein said free-floating alignment rod is cylindrical and has a radius slightly less than a radius of curvature of said indexing notches.

7. The apparatus of claim 1 wherein said free-floating alignment rod is formed of nylon.

8. The apparatus of claim 1 wherein said support means is a cassette for a plurality of parallel semiconductor wafers.

9. A method of aligning a plurality of disk-shaped members having indexing notches comprising steps of:

supporting said disk-shaped members in generally parallel and upright positions;

positioning a free-floating alignment rod below said disk-shaped members and in contact with edges thereof such that said disk-shaped members rest on said alignment rod;

securing said alignment rod into contact with a drive roller such that rotation of said drive roller is transferred to said alignment rod;

rotating said drive roller such that contact of said alignment rod with said edges of said disk-shaped members causes said disk-shaped members to rotate;

transferring a major portion of the weight of an individual disk-shaped member from said alignment rod when an indexing notch of said individual disk-shaped member is rotated into alignment with said alignment rod; and after all of said indexing notches are in alignment with said alignment rod, transferring said weight of said disk-shaped members to said drive roller by providing relative movement between said drive roller and said alignment rod such that said disk shaped members rest on said drive roller for simultaneous aligned rotation.

10. The method of claim 9 further comprising a step of rotating said drive roller to uniformly rotate said indexing notches after said disk-shaped members are rested on said drive roller.

11. The method of claim 9 wherein said step of securing said alignment rod into contact with said drive roller includes capturing said alignment rod against said drive roller using a comb-like structure having teeth aligned to receive said disk-shaped members between adjacent teeth.

12. An orientation apparatus comprising:

a plurality of semiconductor wafers positioned in parallel, each wafer having an indexing notch defined by a radius of curvature;

a flexible alignment rod, said wafers resting on said alignment rod;

means for rotating said alignment rod, including a drive roller having a circumference in frictional contact with said alignment rod; and a comb-like member capturing said alignment rod against said circumference of said drive roller, said comb-like member having an array of teeth aligned to receive one of said wafers between adjacent teeth; said alignment rod being exposed between said adjacent teeth;

wherein said alignment rod has a radius less than said radius of curvature of said indexing notches, said comb-like member being positioned to at least partially support said wafers as said indexing notches are aligned with said alignment rod.

13. The apparatus of claim 12 further comprising means for rotating said comb-like member after said indexing notches are aligned with said alignment rod, wherein said comb-like member is rotated such that said alignment rod follows said circumference of said drive roller.

14. The apparatus of claim 12 wherein said means for rotating said alignment rod includes a motor connected to said drive roller.

15. The apparatus of claim 12 wherein said flexible alignment rod is a nylon member.

* * * * *